US010636707B2

(12) United States Patent
Utsunomiya

(10) Patent No.: US 10,636,707 B2
(45) Date of Patent: Apr. 28, 2020

(54) METHOD OF MANUFACTURING A SEMICONDUCTOR DEVICE

(71) Applicant: ABLIC Inc., Chiba-shi, Chiba (JP)

(72) Inventor: Hiroyuki Utsunomiya, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/124,637

(22) Filed: Sep. 7, 2018

(65) Prior Publication Data

US 2019/0080964 A1 Mar. 14, 2019

(30) Foreign Application Priority Data

Sep. 11, 2017 (JP) .................. 2017-173957

(51) Int. Cl.

| | |
|---|---|
| *H01L 21/268* | (2006.01) |
| *H01L 21/78* | (2006.01) |
| *H01L 21/283* | (2006.01) |
| *H01L 21/683* | (2006.01) |
| *H01L 23/544* | (2006.01) |
| *H01L 21/3213* | (2006.01) |

(52) U.S. Cl.
CPC ............ *H01L 21/78* (2013.01); *H01L 21/268* (2013.01); *H01L 21/283* (2013.01); *H01L 21/32131* (2013.01); *H01L 21/6835* (2013.01); *H01L 21/6836* (2013.01); *H01L 23/544* (2013.01); *H01L 2221/68327* (2013.01); *H01L 2221/68336* (2013.01); *H01L 2221/68368* (2013.01); *H01L 2223/5446* (2013.01)

(58) Field of Classification Search
CPC ................. H01L 21/268; H01L 21/283; H01L 21/32131; H01L 21/6836; H01L 23/544
USPC ......................................................... 438/468
See application file for complete search history.

(56) References Cited

U.S. PATENT DOCUMENTS

| | | | | |
|---|---|---|---|---|
| 5,302,554 | A * | 4/1994 | Kashiwa | ............... H01L 21/304 148/DIG. 28 |
| 2009/0121321 | A1* | 5/2009 | Miccoli | ............... G03F 7/70625 257/618 |
| 2013/0140592 | A1* | 6/2013 | Lee | ..................... H01L 33/0095 257/98 |
| 2018/0096952 | A1* | 4/2018 | Miccoli | ................. H01L 23/562 |

FOREIGN PATENT DOCUMENTS

| | | |
|---|---|---|
| JP | H04-056149 A | 2/1992 |
| JP | H04-335550 A | 11/1992 |

* cited by examiner

*Primary Examiner* — Long K Tran
(74) *Attorney, Agent, or Firm* — Brinks Gilson & Lione

(57) ABSTRACT

Provided is a method of manufacturing a semiconductor device capable of dividing a wafer with metal formed on a rear surface thereof into individual pieces while suppressing chipping and defective cuts. The method of manufacturing a semiconductor device includes: forming a metal layer on a rear surface of a semiconductor substrate; performing blade dicing for the metal layer; and performing stealth Dicing® for the semiconductor substrate.

9 Claims, 5 Drawing Sheets

METHOD OF MANUFACTURING A SEMICONDUCTOR DEVICE

RELATED APPLICATIONS

This application claims priority under 35 U.S.C. § 119 to Japanese Patent Application No. 2017-173957 filed on Sep. 11, 2017, the entire content of which is hereby incorporated by reference.

BACKGROUND OF THE INVENTION

1. Field of the Invention

The present invention relates to a method of manufacturing a semiconductor device, and more particularly, to a method of manufacturing a semiconductor device including a step of dividing a wafer with metal formed on the rear surface thereof into individual pieces.

2. Description of the Related Art

Some wafers on which a power device or the like is formed are structured such that metal (for example, Cu or Ag) is formed as a terminal on a rear surface of the wafer.

When a wafer structured as above is divided into individual pieces by blade dicing, it is required to cut a semiconductor substrate and the metal both. However, a blade and conditions for cutting the semiconductor substrate are different from a blade and conditions for cutting the metal. For instance, when a blade and conditions suitable for the metal are used in the dicing, breaking-off and cracking of the semiconductor substrate (hereinafter also referred to as "chipping") easily occur, whereas the use of a blade and conditions suitable for the semiconductor substrate in the dicing tends to cause the metal on the rear surface to cling to the blade, resulting in clogging of the blade. A clogged blade shows a markedly dropped cutting ability, which causes the chipping of the semiconductor substrate.

With a blade low in metal cutting ability, the metal may not be cut cleanly and may be stretched toward a rear surface thereof, and the stretched portion of the metal may fall off in a later step, with the result that short circuit may occur. There is also a case in which the metal on the rear surface stretches and may not be cut to consequently become defective when the metal is of a highly ductile nature.

In light of those problems, there has heretofore been proposed a method in which the metal on the rear surface is removed along streets in advance, the semiconductor substrate is cut with a blade along the streets from a front surface of the semiconductor substrate, and is divided into individual pieces (see, for example, Japanese Patent Application Laid-open No. H04-056149 and Japanese Patent Application Laid-open No. H04-335550).

In recent years, the trend of wafers structured to have metal on the rear surface is to lower the resistance by making the semiconductor substrate thinner and the metal thicker in order to meet a demand for improved device characteristics, and the recent composition ratio in terms of semiconductor substrate thickness/metal thickness is from approximately 3/2 to approximately 1/1.

Consequently, when the metal on the rear surface is removed along streets in advance as in Japanese Patent Application Laid-open No. H04-056149 and Japanese Patent Application Laid-open No. H04-335550, a very thin semiconductor substrate is cut with a blade, which leads to frequent chipping and a drop in yield and productivity.

SUMMARY OF THE INVENTION

It is therefore an object of the present invention to provide a method of manufacturing a semiconductor device capable of dividing a wafer with metal formed on a rear surface thereof into individual pieces while suppressing chipping and defective cuts.

In one embodiment of the present invention, there is provided a method of manufacturing a semiconductor device including: forming a metal layer on a rear surface of a semiconductor substrate; performing blade dicing for the metal layer; and performing stealth Dicing® for the semiconductor substrate.

According to one embodiment of the present invention, a blade and conditions suitable for the metal layer can be used in the dicing of the metal layer whereas the stealth Dicing® is performed for the semiconductor substrate, resulting in no chipping, and a wafer can accordingly be divided into individual pieces without dropping productivity.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

The invention will now be described herein with reference to illustrative embodiments.

First Embodiment

FIG. 1A to FIG. 1G are sectional views for illustrating steps of a method of manufacturing a semiconductor device according to a first embodiment of the present invention. In particular, the sectional views are illustrations of steps of forming a metal layer on a rear surface of a semiconductor substrate and dividing the semiconductor substrate with the metal layer into individual pieces.

Figure 1A:
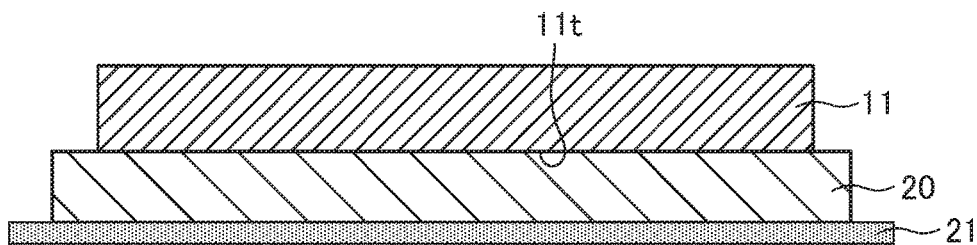
FIG. 1A to FIG. 1G are sectional views for illustrating steps of a method of manufacturing a semiconductor device according to a first embodiment of the present invention.

As illustrated in FIG. 1A, a support substrate 20 and a back-grinding tape 21 are stuck in this order to a front surface 11t of a semiconductor substrate 11, on which a power device, for example, a MOSFET, has been formed.

Figure 1B:
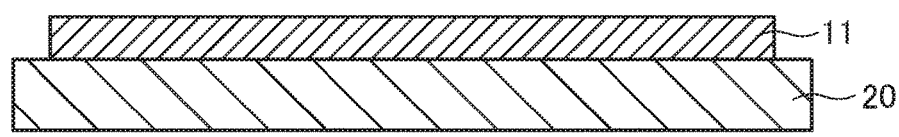

Back grinding is performed next to thin the semiconductor substrate 11, and the back-grinding tape 21 is then peeled off the support substrate 20 as illustrated in FIG. 1B.

Figure 1C:
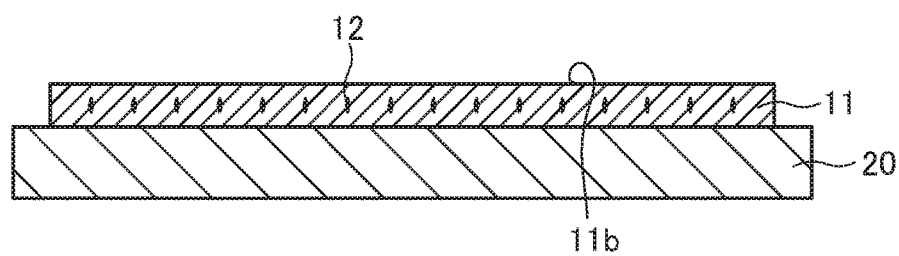
Figure 2:
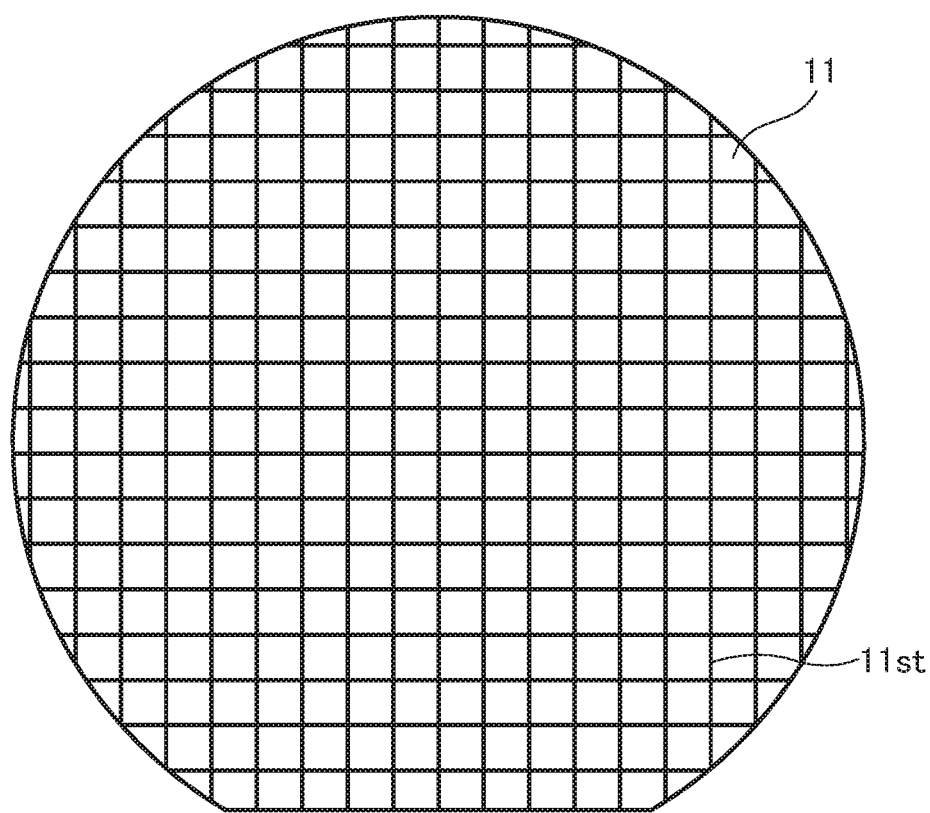
FIG. 2 is a plan view of a semiconductor substrate illustrated in FIG. 1A to FIG. 1G.

The semiconductor substrate 11 is next irradiated with laser light from a rear surface 11b along a plurality of streets 11st illustrated in FIG. 2, and provided in the semiconductor substrate 11 in a grid pattern. Modified layers (damaged layers) 12 are thereby formed inside the semiconductor substrate 11 as illustrated in FIG. 1C.

Figure 1D:
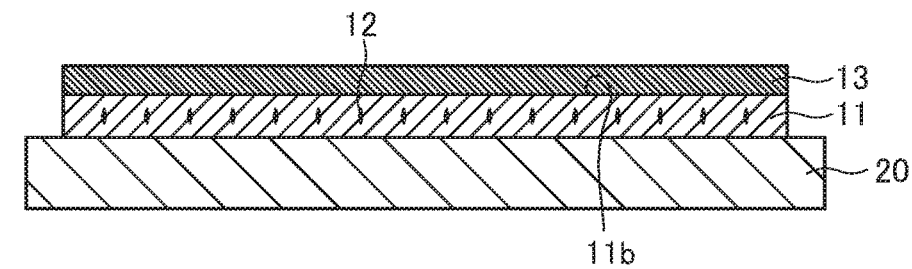

A metal layer 13 is formed next by plating on the rear surface 11b of the semiconductor substrate 11 as illustrated in FIG. 1D.

Figure 1E:
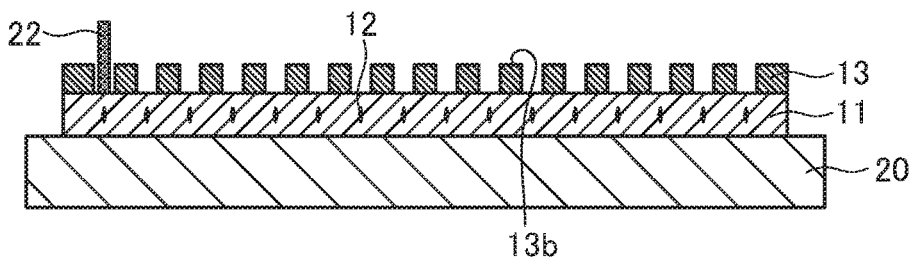

The metal layer 13 is subsequently diced with a blade 22 from a rear surface 13b of the metal layer along the streets 11st (see FIG. 2). The dicing uses a blade and conditions suitable for metal because the semiconductor substrate 11 is not diced at this point. The metal layer 13 is consequently segmented in a grid pattern as illustrated in FIG. 1E.

Figure 1F:
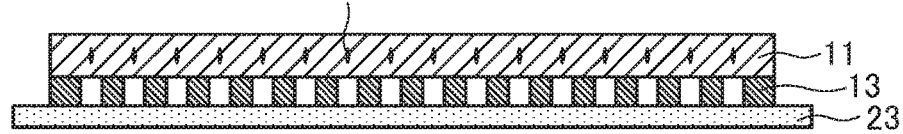

The support substrate 20 is next peeled off the semiconductor substrate 11, and an expanding tape 23 is then stuck to the rear surface of the metal layer 13 as illustrated in FIG. 1F.

Figure 1G:
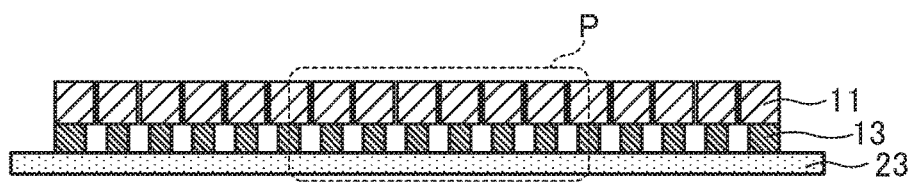

Lastly, the expanding tape 23 is expanded. Since an external force is hence applied to the semiconductor substrate 11, separation progresses upward and downward from the modified layers 12 in the semiconductor substrate 11, with the result that the semiconductor substrate 11 is segmented in a grid pattern along the streets 11st as illustrated in FIG. 1G.

A wafer with the metal layer 13 formed on the rear surface of the semiconductor substrate 11 can be divided into individual pieces in the manner described above.

According to the first embodiment, a blade and conditions suitable for metal can be used to segment the metal layer 13 whereas the semiconductor substrate 11 is segmented by stealth Dicing® (forming of the modified layers 12 and application of the external force), and the wafer can thus be divided into individual pieces while suppressing chipping and defective cuts.

In addition, with the metal layer 13 cut by blade dicing from the rear surface 13b thereof as described above, the stretching of metal toward the rear surface of the metal layer 13 is suppressed and defects due to the falling off of the stretched portion of the metal can be prevented as well.

In the first embodiment, the modified layers 12 are formed by irradiating the semiconductor substrate 11 with laser light from the rear surface 11b of the semiconductor substrate 11 before the metal layer 13 is formed. The modified layers 12 may instead be formed after the metal layer 13 is formed on the rear surface of the semiconductor substrate 11. However, marks, TEGs, and the like are generally arranged in the streets in the front surface 11t of the semiconductor substrate 11, and may become obstacles when the semiconductor substrate 11 is irradiated with laser light from the front surface 11t of the semiconductor substrate 11. This may adversely affect stealth Dicing®. It is therefore desired to irradiate the semiconductor substrate 11 with laser light from the rear surface 11b of the semiconductor substrate 11 before the metal layer 13 is formed as in the first embodiment.

Figure 3:
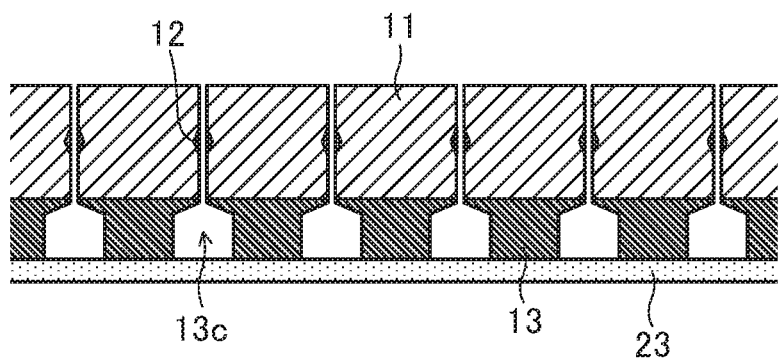
FIG. 3 is a diagram for illustrating an example of a partial enlarged view of FIG. 1G.
Figure 4:
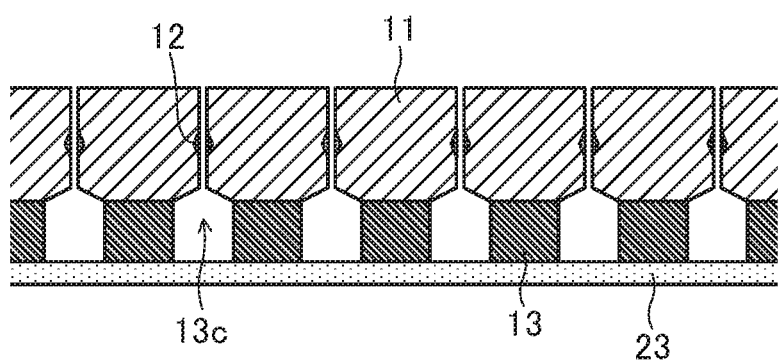
FIG. 4 is a diagram for illustrating another example of a partial enlarged view of FIG. 1G.

FIG. 3 is a diagram for illustrating an example of a partial enlarged view of a portion P of FIG. 1G. FIG. 4 is a diagram for illustrating another example of a partial enlarged view of the portion P of FIG. 1G.

Even when an incision 13c made by the blade 22 does not reach the semiconductor substrate 11 and a thin burr of the metal layer 13 remains at the bottom of the incision 13c in the step of FIG. 1E as illustrated in FIG. 3, the external force applied by the expansion in the step of FIG. 1G causes separation to progress from the modified layers 12 upward and downward, thereby separating the remaining thin burr of the metal layer 13, and the wafer can accordingly be divided into individual pieces.

When the incision 13c made by the blade 22 reaches the semiconductor substrate 11 in the step of FIG. 1E as illustrated in FIG. 4, on the other hand, the expansion causes separation to progress from the incision 13c in the semiconductor substrate 11 as well, and the wafer can therefore be divided into individual pieces more reliably than the wafer with the incision 13c as illustrated in FIG. 3. It is thus desired that the incision 13c made by the blade 22 reaches the semiconductor substrate 11.

However, it is preferred to choose whether to cause the incision 13c to reach the semiconductor substrate 11 depending on the thicknesses of the semiconductor substrate 11 and the metal layer 13 and other conditions and the like.

Second Embodiment

Figure 5:
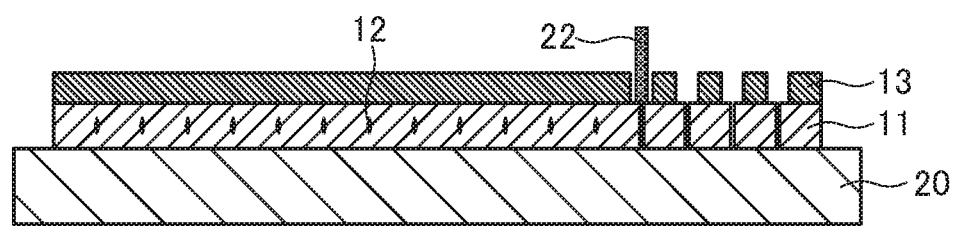
FIG. 5 is a sectional view for illustrating a method of manufacturing a semiconductor device according to a second embodiment of the present invention.

FIG. 5 is a sectional view for illustrating a method of manufacturing a semiconductor device according to a second embodiment of the present invention.

The method of manufacturing a semiconductor device according to the second embodiment is the same as the method of manufacturing a semiconductor device according to the first embodiment, which is illustrated in FIG. 1A to FIG. 1G, up to the step of FIG. 1D. Components that are the same as those in the first embodiment are therefore denoted by the same reference numerals, and redundant descriptions are omitted from the second embodiment as appropriate.

In the second embodiment, after the metal layer 13 is formed on the rear surface 11b of the semiconductor substrate 11 as illustrated in FIG. 1D, the metal layer 13 is diced with the blade 22 from the rear surface 13b of the metal layer 13 along the streets 11st (see FIG. 2) as illustrated in FIG. 5. By conducting the blade dicing so as to impress a force upon the semiconductor substrate 11, an external force is applied to the semiconductor substrate 11 and causes separation to progress from the modified layers 12 upward and downward, thus dividing the wafer into individual pieces successfully. According to the second embodiment, an expanding tape is therefore not required and the manufacturing steps can thus be simplified. The second embodiment is effective when the thickness of the semiconductor substrate 11 after back grinding is particularly thin.

Third Embodiment

Figure 6A:
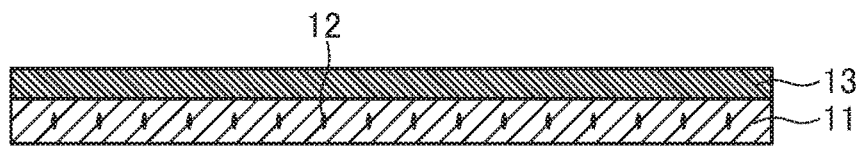
FIG. 6A to FIG. 6C are sectional views for illustrating steps of a method of manufacturing a semiconductor device according to a third embodiment of the present invention.
Figure 6B:
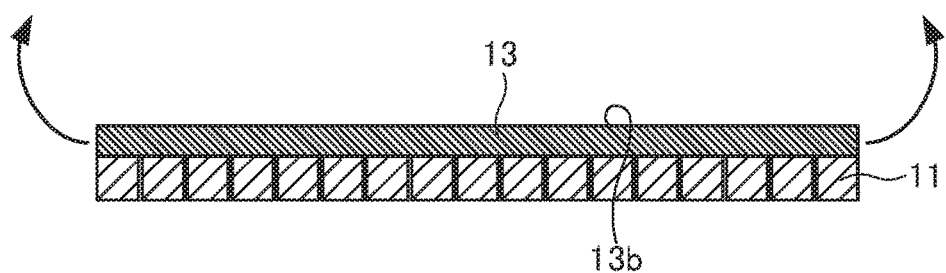
Figure 6C:
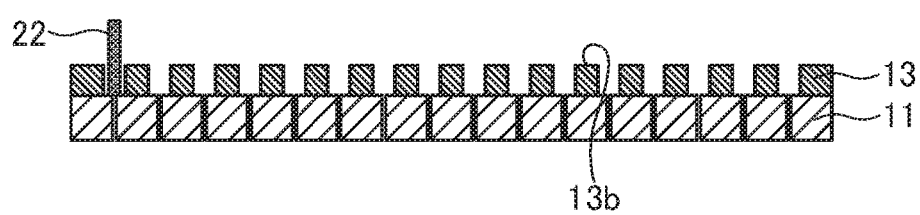

FIG. 6A to FIG. 6C are sectional views for illustrating a method of manufacturing a semiconductor device according to a third embodiment of the present invention.

The method of manufacturing a semiconductor device according to the third embodiment is the same as the method of manufacturing a semiconductor device according to the first embodiment, which is illustrated in FIG. 1A to FIG. 1G, up to the step of FIG. 1D. Components that are the same as those in the first embodiment are therefore denoted by the same reference numerals, and redundant descriptions are omitted from the third embodiment as seen fit.

In the third embodiment, after the metal layer 13 is formed on the rear surface 11b of the semiconductor substrate 11 as illustrated in FIG. 1D, the support substrate 20 is peeled off the front surface of the semiconductor substrate 11 as illustrated in FIG. 6A.

The metal layer 13 is next warped in the direction of the rear surface 13b of the metal layer 13 as illustrated in FIG. 6B, thereby applying an external force to the semiconductor substrate 11 and segmenting the semiconductor substrate 11 along the modified layers 12 in a grid pattern.

The metal layer 13 is then diced with the blade 22 from the rear surface 13b of the metal layer 13 as illustrated in FIG. 6C. As a result, the metal layer 13 is segmented in a grid pattern as well, and thus the dividing of the wafer into individual pieces is completed.

It is apparent that the present invention is not limited to the above embodiments, but may be modified and changed without departing from the scope and spirit of the invention.

For instance, while the semiconductor substrate 11 is segmented by expansion after blade dicing is performed on the metal layer 13 in the first embodiment, the segmentation of the semiconductor substrate 11 by expansion may be executed first to be followed by the blade dicing of the metal layer 13 when the metal layer 13 has high ductility.

The support substrate 20 which is used in back grinding in the embodiments described above may not be used.

What is claimed is:

1. A method of manufacturing a semiconductor device, comprising:
    providing a substrate having a front surface and a rear surface opposite to the front surface;
    forming a metal layer on the rear surface of a semiconductor substrate;
    applying an expanding tape to the metal layer and expanding the expanding tape;
    blade dicing the metal layer; and
    stealth Dicing® the semiconductor substrate.

2. A method of manufacturing a semiconductor device, comprising:
    forming modified layers inside a semiconductor substrate by irradiating the semiconductor substrate with a laser light along streets in the semiconductor substrate;
    forming a metal layer on a rear surface of the semiconductor substrate;
    dicing the metal layer with a blade along the streets; and
    dicing the semiconductor substrate by applying an external force to the modified layers of the semiconductor substrate.

3. The method of manufacturing a semiconductor device according to claim 2, wherein forming of the metal layer is performed after the forming of the modified layers, and wherein the semiconductor substrate is irradiated with the laser light from the rear surface of the semiconductor substrate.

4. The method of manufacturing a semiconductor device according to claim 2, wherein the external force is applied by sticking an expanding tape to a rear surface of the metal layer and expanding the expanding tape.

5. The method of manufacturing a semiconductor device according to claim 3, wherein the external force is applied by sticking an expanding tape to a rear surface of the metal layer and expanding the expanding tape.

6. The method of manufacturing a semiconductor device according to claim 2, wherein the external force is applied by the blade in the dicing of the metal layer.

7. The method of manufacturing a semiconductor device according to claim 3, wherein the external force is applied by the blade during the dicing of the metal layer.

8. The method of manufacturing a semiconductor device according to claim 2, wherein the external force is applied by warping the metal layer in a direction of a rear surface of the metal layer.

9. The method of manufacturing a semiconductor device according to claim 3, wherein the external force is applied by warping the metal layer in a direction of a rear surface of the metal layer.

* * * * *

UNITED STATES PATENT AND TRADEMARK OFFICE
CERTIFICATE OF CORRECTION

| | | |
|---|---|---|
| PATENT NO. | : 10,636,707 B2 | Page 1 of 1 |
| APPLICATION NO. | : 16/124637 | |
| DATED | : April 28, 2020 | |
| INVENTOR(S) | : Hiroyuki Utsunomiya | |

It is certified that error appears in the above-identified patent and that said Letters Patent is hereby corrected as shown below:

On the Title Page

<u>In the Abstract</u>
At Line 7, delete "stealth Dicing" and insert in its place --STEALTH DICING--.

In the Specification

In Column 2, Line 15, delete "stealth Dicing" and insert in its place --STEALTH DICING--.

In Column 2, Line 19, delete "stealth Dicing" and insert in its place --STEALTH DICING--.

In Column 3, Line 33, delete "stealth Dicing" and insert in its place --STEALTH DICING--.

In Column 3, Line 53, delete "stealth Dicing" and insert in its place --STEALTH DICING--.

In the Claims

In Column 5, Claim 1, Line 30, delete "stealth Dicing" and insert in its place --STEALTH DICING--.

Signed and Sealed this
Sixteenth Day of June, 2020

Andrei Iancu
*Director of the United States Patent and Trademark Office*